(12) United States Patent
Grebennikov et al.

(10) Patent No.: US 6,552,610 B1
(45) Date of Patent: Apr. 22, 2003

(54) TRANSMISSION-LINE TUNED SWITCHING POWER AMPLIFIER

(75) Inventors: Andrei Viktorovich Grebennikov, Cork (IE); Herbert Jaeger, Cork (IE)

(73) Assignee: MVA.com Eurotec, B.V., Amsterdam (NL)

( * ) Notice: Subject to any disclaimer, the term of this patent is extended or adjusted under 35 U.S.C. 154(b) by 0 days.

(21) Appl. No.: 10/047,544

(22) Filed: Jan. 15, 2002

(51) Int. Cl.$^7$ .............................................. H03F 3/217
(52) U.S. Cl. ..................... 330/251; 330/207 A; 330/302
(58) Field of Search ............................. 370/207 A, 251, 370/302

(56) References Cited

U.S. PATENT DOCUMENTS

| | | | |
|---|---|---|---|
| 3,919,656 A | | 11/1975 | Sokal et al. ................... 330/51 |
| 5,434,540 A | * | 7/1995 | Yamamoto et al. .......... 330/251 |
| 6,181,208 B1 | | 1/2001 | King et al. .................. 330/295 |
| 6,236,274 B1 | * | 5/2001 | Liu .............................. 330/302 |

OTHER PUBLICATIONS

V. B. Kozyrev, "Single–Ended Switching–Mode Tuned Power Amplifier with Filtering Circuit" (in Russian), Poluprovodnikovye pribory v tekhnike svyazi, vol. 6, pp. 152–166, 971.

* cited by examiner

*Primary Examiner*—Henry Choe

(57) ABSTRACT

A tuned switching power amplifier having a switch for receiving an AC input signal. The switch controls the application of DC power to a load through a load network. The load network develops a parallel inductance and a parallel capacitance across the switch that minimizes power losses associated with the switch by creating a transient response across the switch that insures that, when the switch transitions from on to off, the voltage across the switch remains low until the current trough the switch reaches zero, and that, when the switch transitions from off to on, the voltage across the switch is zero and has a substantially zero time derivative prior to when the switch transitions from off to on. The parallel inductance is developed by a transmission line of a determined electrical length.

20 Claims, 4 Drawing Sheets

TRANSMISSION-LINE TUNED SWITCHING POWER AMPLIFIER

FIELD OF THE INVENTION

The present invention relates to amplifiers and, more particularly, to a tuned switching power amplifier.

BACKGROUND OF THE INVENTION

Amplifiers are commonly used to increase the strength of electrical signals. To increase the strength of an electrical signal, typically, the electrical signal is used to control a flow of energy from a DC power source, e.g., a battery, to produce an output signal that varies in the same way as the electrical signal but has a larger amplitude. Generally, it is desirable to efficiently amplify the electrical signal using a minimal amount of power to reduce energy costs and increase battery life, for example.

One method for efficiently amplifying electrical signals is disclosed in U.S. Pat. No. 3,919,656 to Sokal et al., entitled High-Efficiency Tuned Switching Power Amplifier, incorporated fully herein by reference. Additionally, U.S. Pat. No. 3,919,656 contains a detailed discussion of power amplifiers.

FIG. 1 is a circuit diagram of a tuned switching power amplifier 100 as disclosed in U.S. Pat. No. 3,919,656. The amplifier 100 includes a switch 102 responsive to an input signal from a signal source 104, a DC power source 106, and a load network 108 to create a transient response across the switch 102 and pass an amplified version of the input signal to a load 110. In operation, the switch 102 controls the flow of current from the DC power source 106 based on the input signal to generate an output signal at the load 110 having a greater amplitude than the input signal at the same frequency. The operating frequency of the amplifier 100 is its fundamental frequency.

In the amplifier 100, power may be wasted by the switch 102 in the form of heat when current is flowing through the switch 102 at the same time there is a voltage drop across the switch 102. Accordingly, to increase efficiency, the amplifier 100 is designed to: a) minimize the voltage across the switch 102 when appreciable current flows through it; b) minimize the current flowing through the switch 102 when appreciable voltage exists across it; and c) minimize the duration of simultaneous appreciable voltage across the switch 102 and current through the switch 102.

The load network 108 functions to produce a transient response across the switch 102 that satisfies the above design conditions. The load network 108 includes a current feed choke 112, a bypass capacitor 114, a parallel capacitor 116, a frequency filter 118, and a series inductor 120. The current feed choke 112 may be a quarter-wave transmission line (TL), i.e., a TL having an electrical length of 90° in reference to the fundamental frequency, with negligibly small inductive susceptance for supplying essentially a constant current during the operation of the amplifier 100. If the inductive susceptance of the current feed choke 112 is not negligibly small, the capacitance of the parallel capacitor 116 is increased, thereby increasing the susceptance of a path containing the parallel capacitor 116 and effectively removing the current feed choke 112 from the amplifier 100 at the fundamental frequency. The frequency filter 118 includes a capacitor 122 and an inductor 124, and is designed so that only signals at the fundamental frequency are allowed to pass through the frequency filter 118, i.e., the frequency filter 118 is tuned to the fundamental frequency.

FIG. 2 illustrates the impedance as seen by the switch 102 at the fundamental frequency. At the fundamental frequency, the current feed choke 112 acts as an infinite impedance and the frequency filter 118 acts as a short. Therefore, the resultant impedance seen by the switch 102 can be represented by the parallel capacitor 116, the series inductor 120, and the impedance of the load 110. Accordingly, the parallel capacitor 116 and the series inductor 120 are the primary elements for producing a desired transient response across the switch 102.

Often, the size of an amplifier 100 is an important criteria depending on the application for which the amplifier 100 will be used. If an amplifier 100 having a small form factor is desired, a current feed choke 112 implemented using a TL with an electrical length of 90° may inhibit a reduction in the size of the amplifier. In addition, the series inductor 120 may adversely contribute to the size of the amplifier 100 and in conjunction with the parallel capacitor 116 may produce an undesirable impedance transformation at the output of the amplifier 100. Accordingly, there is a need for an efficient tuned switching power amplifier having less series inductance and a parallel TL with an electrical length of less than 90°. The present invention fulfills this need among others.

SUMMARY OF THE INVENTION

The present invention provides for a switching tuned power amplifier apparatus and method that overcomes the aforementioned problems by placing a parallel capacitor and a parallel TL having an electrical length of less than 90° across a switch within the amplifier. The parallel capacitor and parallel TL create a transient response across the switch that minimizes current and voltage existing across the switch simultaneously. By using a capacitor and a TL having an electrical length of less than 90° in parallel across the switch, efficient tuned switching power amplifiers having smaller form factors and desirable impedance transformation can be realized.

One aspect of the present invention is a switching amplifier apparatus for amplifying an input signal having a fundamental frequency to develop an output signal with the same frequency at a load. The amplifier includes a switch having a control for receiving the input signal, the switch responsive to the input signal to turn the switch on and off, the switch further having first and second terminals, the first and second terminals having a low impedance therebetween when the switch is on and having a high impedance therebetween when the switch is off, a load network coupled to the switch to deliver the output signal to the load, the load network including a TL of a determined length coupled between the first and second terminals to develop a parallel inductance across the switch and a parallel capacitor coupled between the first and second terminals to develop a parallel capacitance across the switch, a DC power source for supplying DC power to the TL, the parallel capacitor, and the switch. The TL and the parallel capacitor create a transient response across the switch that insures that, as the switch transitions from on to off, the voltage across the first and second terminals remains low until the current through the first and second terminals is substantially zero, and, prior to the switch's transition from off to on, the voltage across the first and second terminals and the voltage time derivative are substantially zero.

Another aspect of the invention is a method for amplifying an input signal having a fundamental frequency to develop an output signal with the same frequency at a load. The method includes applying the input signal to a switch responsive thereto, developing parallel inductance across the switch with a TL of a determined length, developing parallel capacitance across the switch, supplying DC voltage to the switch, the parallel inductance, and the parallel capacitance, wherein the parallel inductance and capacitance develop a transient response across the switch to insure the voltage across the switch remains low, as the switch transitions from on to off, until the current through the switch is substantially zero, and the voltage across the switch and the voltage time derivative are substantially zero prior to the switch's transition from off to on.

DETAILED DESCRIPTION OF THE INVENTION

Figure 3:
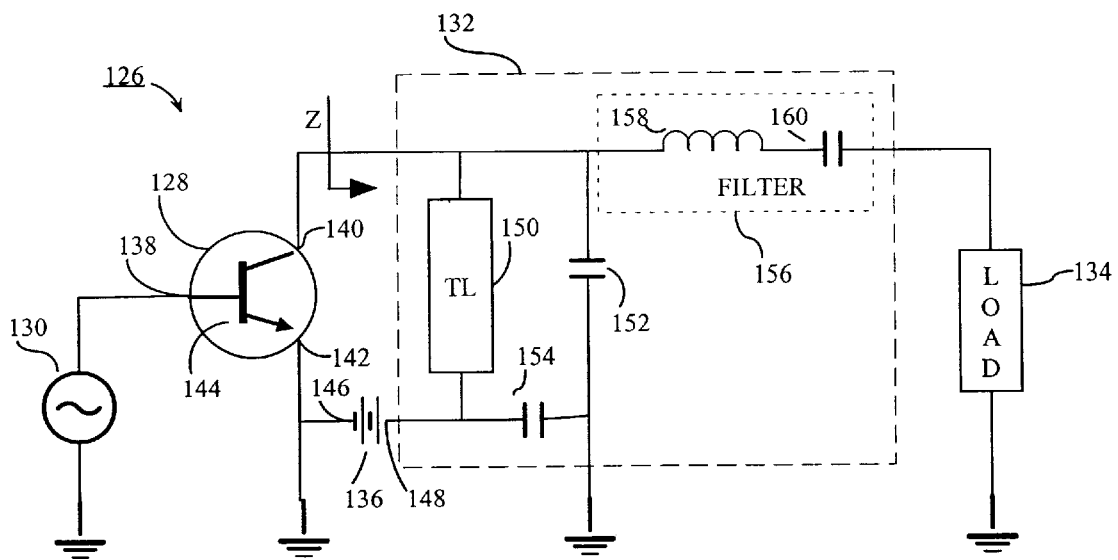
FIG. 3 is a circuit diagram of a tuned switching power amplifier in accordance with the present invention.

FIG. 3 depicts an embodiment of a tuned switching power amplifier 126 in accordance with the present invention. The amplifier 126 includes a switch 128 for receiving an input signal from a signal source 130, a load network 132 coupled between the switch 128 and a load 134 to create a transient response across the switch 128 and deliver an output signal to the load 134, and a DC power source 136 for supplying DC power to the switch 128, the load network 132, and the load 134. In a general overview, during operation of the amplifier 126, the load network 132 develops a parallel inductance and a parallel capacitance across the switch 128 to create a transient response at the switch 128 that insures that, as the switch 128 transitions from on to off, the voltage across the switch 128 remains low until the current through the switch 128 is substantially zero, and, prior to the switch's transition from off to on, the voltage across the switch 128 and the voltage time derivative are substantially zero. Accordingly, substantial voltage across the switch 128 and substantial current through the switch 128 do not exist simultaneously, thereby preventing the dissipation of power by the switch 128 and maximizing the efficiency of the amplifier 126.

The signal source 130 develops the input signal for amplification by the amplifier 126. The amplifier 126 produces an output signal that varies in the same way as the input signal, but with a larger amplitude. In the illustrated embodiment, the signal source 130 is a known sine wave generator coupled between ground and a control terminal 138 of the switch 128 for supplying the input signal to the switch 128. The frequency at which the amplifier 126 operates is its fundamental frequency, which, in the illustrated embodiment, is the frequency of the input signal generated by the signal source 130. The amplifier 126 is particularly useful, but not exclusively so, in wireless communication devices and other high frequency applications. For example, the amplifier 126 may be used in a cellular telephone to amplify an input phase modulated signal of a certain channel frequency in the 900 MHz frequency band (i.e., 880–915 MHz) or 1800 MHz frequency band (i.e., 1710–1785 MHz, 1850–1910 MHz) for transmission by an antenna, which may be represented by the load 110. In this example, the amplifier 126 is designed such that its fundamental frequency matches the channel frequency. In addition, the amplifier 126 may be used at essentially any operating frequency for narrowband or broadband applications, including 2.4–2.5 GHz and 5 GHz bands.

The switch 128 selectively completes a circuit including the DC power source 136 and the load network 132 based on the input signal. The switch 128 includes the control terminal 138 for turning the switch 128 on and off based on the signal at the control terminal 138, i.e., the switch 128 is responsive to the signal. In addition, the switch 136 includes a first current flow terminal 140 and a second current flow terminal 142 that are electrically coupled when the switch 128 is on and uncoupled when the switch 128 is off. When the switch 128 is on, the first and second current flow terminals 140 and 142 have essentially infinite impedance therebetween. When the switch 128 is off, the first and second current flow terminals 140 and 142 have essentially zero impedance therebetween.

In the illustrated embodiment, the control terminal 138 of the switch 128 is coupled to the signal source 130, the first current flow terminal 140 is coupled to the load network 132, and the second current flow terminal 142 is coupled to ground and a negative terminal 146 of the DC power source 136. The switch 128 may be a transistor 144, such as a NPN transistor connected in the common-emitter mode, as illustrated in FIG. 3.

The DC power source 136 supplies DC power to the switch 128, the load network 132, and the load 134. In the illustrated embodiment, the DC power source 136 has a negative terminal 136 coupled to the second current flow terminal 142 of the switch 128 and ground and a positive terminal 148 coupled to the load network 132. A suitable DC power source 136 will be readily apparent to those skilled in the art.

The load network 132 delivers an output signal to the load 134, which is based on the input signal, and develops a transient response across the first and second current flow terminals 140 and 142 of the switch 128. The load network 132 includes a parallel TL 150, a parallel capacitor 152, a bypass capacitor 154, and a frequency filter 156. The load network 132 may contain additional passive and active components, however, elements that dissipate energy, e.g., resistors, should be avoided to attain maximum power efficiency.

The frequency filter 156 prevents harmonics of the fundamental frequency generated by the amplifier 126 from reaching the load 134. The frequency filter 136 is tuned in a known manner so that only signals at the fundamental frequency are allowed to pass through the frequency filter 156. In the illustrated embodiment, the frequency filter 156 includes an inductor 158 and a capacitor 160 coupled in series to form a bandpass filter.

The bypass capacitor 154 couples the positive terminal 148 of the DC power source 136 and the TL 150 to ground. For AC signals, the bypass capacitor 154 insures the positive terminal 148 of the DC power source 136 and the second current flow terminal 142 of the switch 128 are electrically equivalent. In addition, for AC signals, the bypass capacitor 154 provides a ground path for the TL 150. The bypass capacitor 154 may be a low-impedance capacitor, which may be considered part of the DC power source 136, or part of the load network 132.

The parallel capacitor 152 develops a parallel capacitance across the switch 128 at the fundamental frequency. In the illustrated embodiment, the parallel capacitor 152 is coupled between the first current flow terminal 140 of the switch 128 and ground. At the fundamental frequency, the parallel capacitor 152 has appreciable capacitive susceptance. In certain embodiments, the parallel capacitor may have a capacitance of between about 1 pF and about 100 pF. Capacitance which is inherent to the circuit wiring of the amplifier 126 and the switch 128 decreases the amount of capacitance required from the parallel capacitor 152. For example, at high frequencies, all of the capacitance may be supplied by the circuit wiring capacitance, such that a parallel capacitor 152 as a separate component is not needed.

The parallel TL 150 develops a parallel inductance across the switch 128 at the fundamental frequency. The parallel TL 150 is a non-quarter wavelength TL, i.e., has an electrical length of less that 90°, in relation to the fundamental frequency. A quarter wavelength TL will have essentially infinite reactance at the fundamental frequency, while a non-quarter wavelength TL, such as TL 150, will have less reactance. For example, the reactance of the TL 150 may be less than about 10 Kohms and, typically, less than about 100 ohms. In certain embodiments, the parallel TL 150 has an electrical length of less that about 45° and, typically, has an electrical length of between about 5° and about 15°, e.g., about 7°. In the illustrated embodiment, the parallel TL 150 is coupled between the first current flow terminal 140 and the positive terminal 148 of the DC power source 136. In certain embodiments, the TL 150 is sufficiently large so as to act as a source of substantially constant current. In an alternative embodiment, another TL is employed as a current source, thereby relieving the parallel TL 150 of this function.

In the present invention, the parallel capacitor 152 and the parallel TL 150 function together to create the transient response across the switch 128 that insures that, as the switch 128 transitions from on to off, the voltage across the first and second terminals 140 and 142 remains low until the current through the first and second terminals 140 and 142 is substantially zero, and that, prior to the switch's transition from off to on, the voltage across the first and second terminals 140 and 142 and the voltage time derivative are substantially zero.

Figure 1:
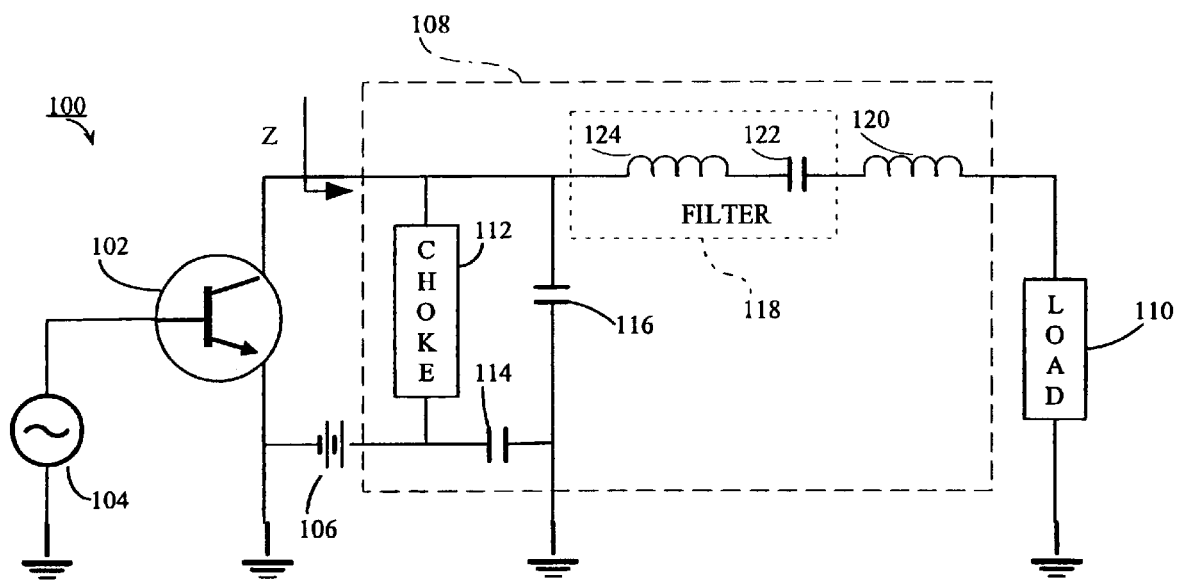
FIG. 1 is a circuit diagram of a prior art tuned switching power amplifier.
Figure 2:
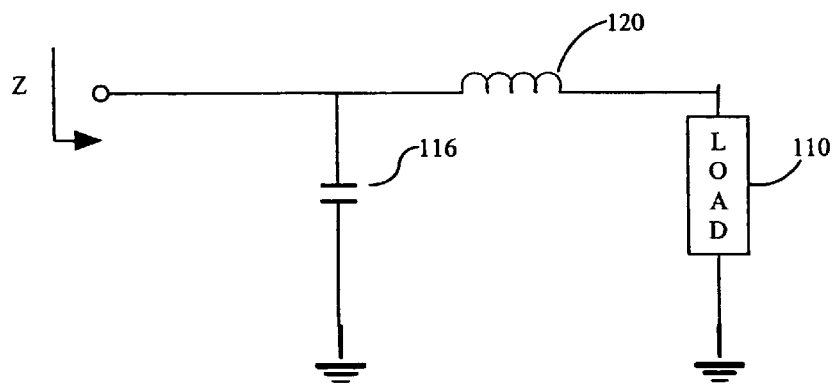
FIG. 2 is a circuit diagram of a prior art equivalent circuit representing the load network at a fundamental frequency for use in the amplifier of FIG. 1.
Figure 4:
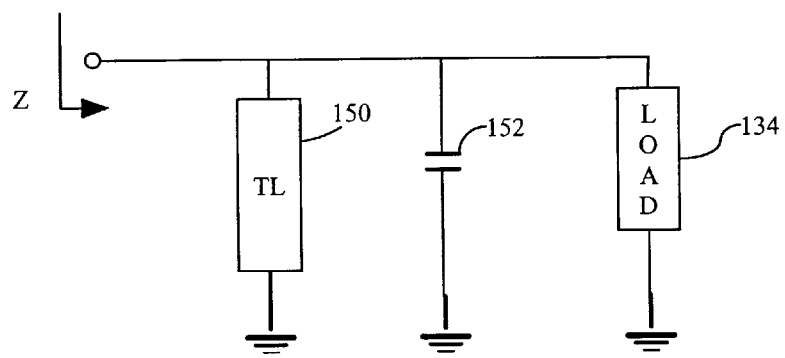
FIG. 4 is a circuit diagram of an equivalent circuit representing the load network at a fundamental frequency for use in the amplifier of FIG. 3.

FIG. 4 depicts a circuit reflecting the impedance as seen by the switch 128 at the fundamental frequency. At the fundamental frequency, the frequency filter 156 acts as a short and the TL 150 passes current, i.e., is a non-quarter wavelength TL. Therefore, the impedance as seen by the switch 128 can be modeled by the parallel TL 150, the parallel capacitor 152, and the load 134 as depicted in FIG. 4. This is different than the amplifier 100 (FIG. 1) disclosed in U.S. Pat. No. 3,919,656 to Sokal et al., where the impedance as seen by the switch 102 is modeled by the parallel capacitor 116, the series inductor 120, and the load 110 as illustrated in FIG. 2.

During operation of the amplifier 126 (FIG. 3), the switch 128 controls the frequency at which DC energy from the DC power source 136 is converted into AC energy for delivery to the load 134. In one embodiment, to obtain the maximum fundamental-frequency output, the duty ratio of the switch 128 is made substantially 50% so that the switch is on for substantially half of the AC period and off for the remainder of the period. (Optionally, the duty ratio may be made other than 50%.)

Figure 5A:
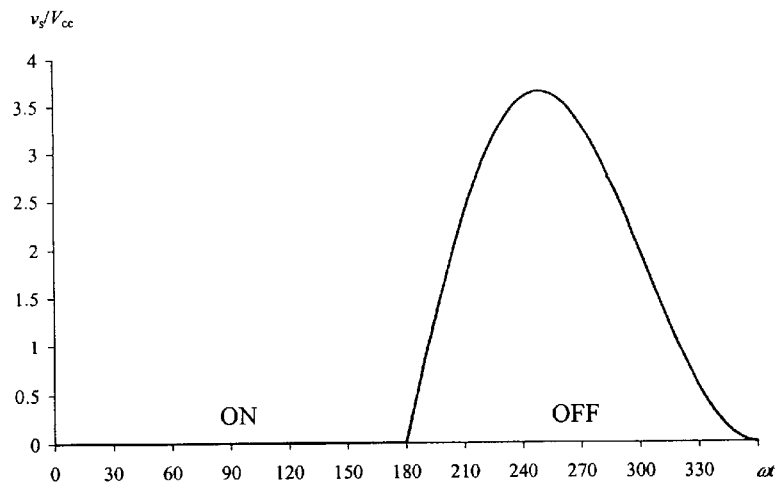
FIG. 5A is a graph illustrating a voltage waveform across the switch of FIG. 3.
Figure 5B:
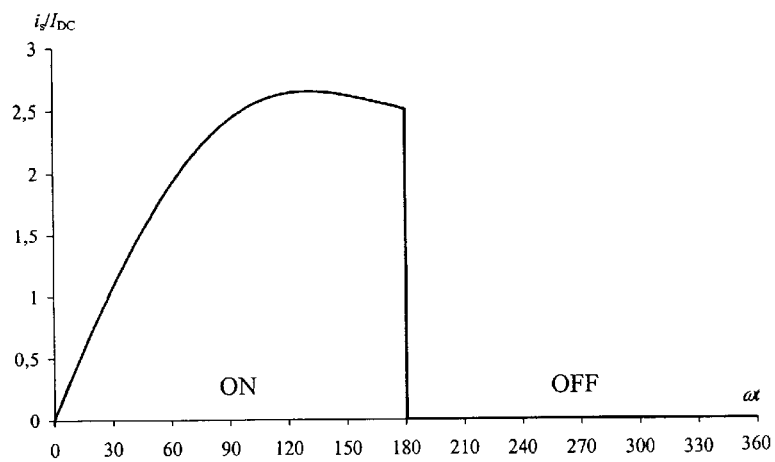
FIG. 5B is a graph illustrating a current waveform across the switch of FIG. 3.

The parallel TL 150 and the parallel capacitor 152 create a transient response across the switch 128 that shapes the voltage and current waveforms across the switch 128. Waveforms representative of the voltage and current waveforms across the switch 128 of FIG. 3 are depicted in FIGS. 5A and 5B, respectively. The parallel capacitor 152, insures that in the time interval during which the switch 128 is being turned off, the voltage across the switch 128 remains relatively low until after the current through the switch 128 has fallen to zero. This avoids energy loss that would occur if the voltage across the switch 128 were allowed to rise rapidly before the current dropped to zero.

The transient response when the switch 128 is off causes the voltage across the switch 128 to fall to approximately zero as the switch 128 is turned on, thereby avoiding the energy loss associated with discharging the parallel capacitor 152 from a high positive voltage to ground. In addition, the transient response creates a zero slope for the voltage waveform representing the voltage across the switch 128 as it reaches zero. These two conditions together insure that there in no current flow through the switch 128 when the switch 128 is turned on. This avoids energy loss that would occur if the voltage across the switch 128 were allowed to drop slowly as current started flowing through the switch 128.

In accordance with one embodiment of the present invention, the component values for the components of the amplifier 126 of FIG. 3 may be selected according to equations 1–5 below.

The electrical length, θ, of the parallel TL 150 can be determined using the following equation:

$$\theta = in v\tan\left(0.732\frac{R}{Z}\right); \quad (1)$$

where R is the resistance of the TL 150 and Z is the characteristic impedance of the TL 150. The characteristic impedance, Z, may be a typical characteristic impedance for a TL, such as between about 25 ohms and about 75 ohms, e.g., 50 ohms. The resistance, R, can be determined using the following equation:

$$R = 1.365\frac{V^2}{P}, \quad (2)$$

where V is the voltage level of the DC power source 136 and P is the output power of the amplifier 126. The electrical length, θ, can then be determined by selecting a TL with a characteristic impedance, determining the resistance by solving for equation (2), substituting the characteristic impedance and determined resistance into equation (1), and solving for the electrical length, θ. For example, if a TL is selected having a characteristic impedance, Z, of 50 ohms, V equals 3.5V, and P=2 Watts, then R equals approximately 8.4 ohms and the electrical length, θ, is approximately 7°.

The capacitance of the parallel capacitor 152 can be determined using the following equation:

$$C = \frac{0.685}{\omega R}, \quad (3)$$

where $\omega$ is the fundamental frequency.

For the frequency filter 156, the capacitance for the series capacitor 160 can be determined using the following equation:

$$C = \frac{1}{\omega R Q_L}; \text{ and} \quad (4)$$

the inductance for the series inductor can be determined using the following equation:

$$L = \frac{1}{\omega^2 C}, \quad (5)$$

where $Q_L$ is the quality factor for the frequency filter 156, which can be determined in a known manner.

For component values selected using the above equations, the optimum phase angle, $\phi$, for the current and voltage across the switch at the fundamental frequency can be derived from equations (1) and (2) as follows:

$$\phi = in v \tan\left(\frac{R}{Z}\tan\theta - \omega RC\right). \quad (6)$$

Actual values for equations (1) and (2) are then substituted into equation (6) to yield a phase angle of 34.244°.

Figure 5C:
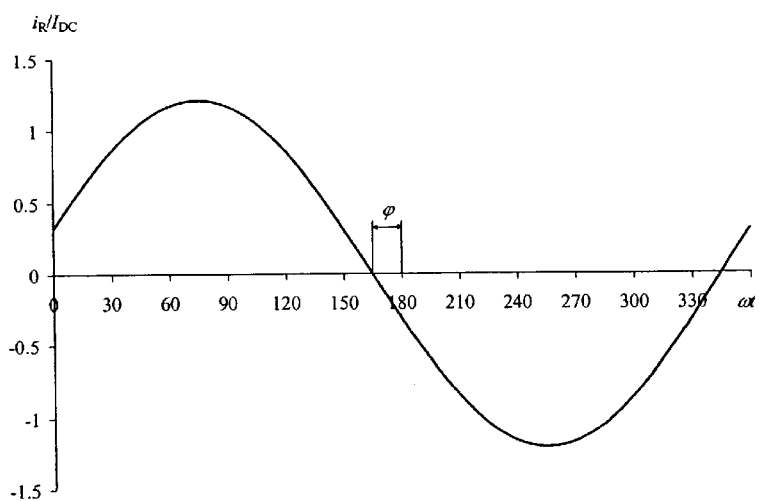
FIG. 5C is a graph illustrating a current waveform for the output of the amplifier of FIG. 3.

In an ideal lossless switching condition having a parallel TL 150 with high characteristic impedance, Z, and short electrical length, $\theta$, e.g., tan $\theta$=0, the load network 132 with components selected according to equations (1) through (5) provides a near 100 percent efficiency by producing the voltage and current waveforms, $v_s(\omega t)$ and $i_s(\omega t)$, during off and on states of the switch as shown in FIGS. 5A and 5B, respectively. At the same time, the sinusoidal fundamental frequency current shown in FIG. 5C flows through the frequency filter 156 to the load 134. The equation for the fundamental frequency current is:

$$i_r(\omega t) = I_R \sin(\omega t + \phi), \quad (7)$$

where the phase shift, $\phi$, is 15.155 degree.

Figure 6:
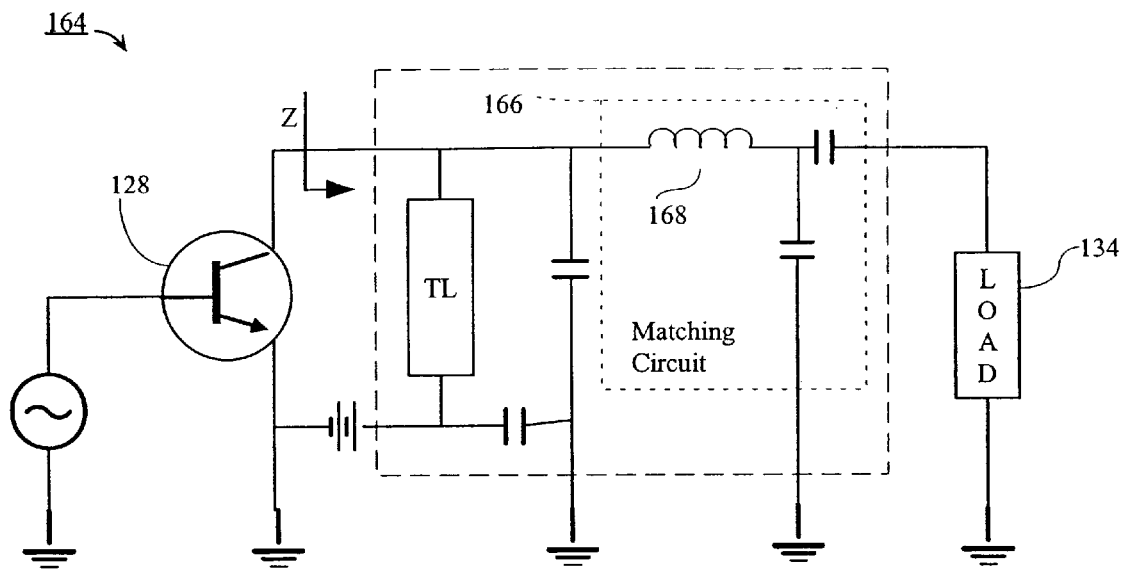
FIG. 6 is a circuit diagram of an alternative tuned switching power amplifier in accordance with the present invention.

FIG. 6 depicts an amplifier 164 in accordance with an alternative embodiment of the present invention. The amplifier 164 is essentially the amplifier 126 of FIG. 3 with an impedance matching circuit 166 substituted for the frequency filter 136 (FIG. 3) of amplifier 126. The impedance matching circuit 166 performs an impedance transformation between the load 134 and the switch 128 in a known manner. In addition, the matching circuit 166 acts as a frequency filter to suppress harmonics of the fundamental frequency. The matching circuit 166 can be designed in a known manner with many different combinations of lumped capacitors and inductors. In certain embodiments, the first component of the matching circuit is a series inductor 168, as shown in FIG. 6, to provide a high-impedance condition at the input of the matching circuit 166.

Figure 7:
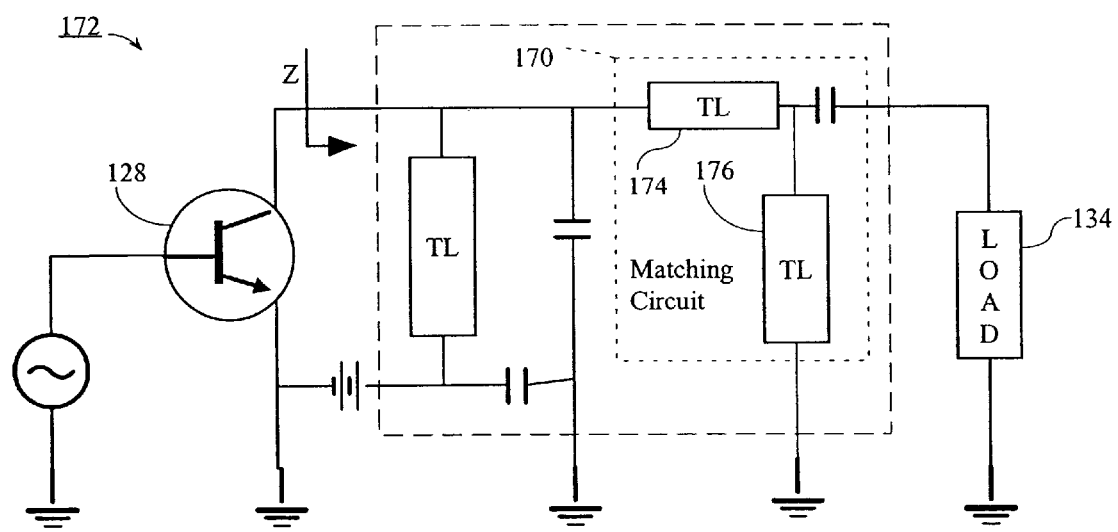
FIG. 7 is a circuit diagram of an alternative tuned switching power amplifier for use in high frequency applications in accordance with the present invention.

For microwave frequencies and higher, as shown in FIG. 7, all inductive components in a matching circuit 170 of an amplifier 172 may be realized using TLs, such as a series TL 174 and a parallel TL 176. The matching circuit 170 may include TLs with open-circuit and short-circuit stubs to provide the required matching and harmonic suppression characteristics.

In certain embodiments, the series TL 174 is the first element of the matching circuit 170, as illustrated in FIG. 7, to provide desirable switching conditions.

A switching power amplifier in accordance with the present invention can be converted to a parallel feedback oscillator by obtaining the input signal for the switch from a point within the amplifier or at the output of the amplifier. In addition, a negative resistance oscillator can be developed by providing negative impedance conditions at the switch by inserting reactive feedback within the circuit in a known manner. In these oscillators, a separate signal source 130 is not needed.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. An apparatus for amplifying an input signal having a fundamental frequency to develop an output signal with the same frequency at a load, said apparatus comprising:
    a switch having a control terminal for receiving the input signal, said switch responsive to the input signal to turn said switch on and off, said switch further having first and second current flow terminals, said first and second current flow terminals having a low impedance therebetween when said switch is on and having a high impedance therebetween when said switch is off;
    a load network coupled to said switch to deliver the output signal to the load, said load network including a transmission line (TL) of a determined electrical length coupled between said first and second current flow terminals and a parallel capacitor coupled between said first and second current flow terminals to develop a parallel inductance and a parallel capacitance across said switch; and
    a DC power source for supplying DC power to said load network and said switch;
    wherein said TL and said parallel capacitor create a transient response across said switch that insures that, as the switch transitions from on to off, the voltage across the first and second terminals remains low until the current through the first and second terminals is substantially zero, and, prior to the switch's transition from off to on, the voltage across the first and second terminals and the voltage time derivative are substantially zero.

2. The apparatus of claim 1, wherein said switch is a transistor.

3. The apparatus of claim 1, wherein said TL has a reactance of less than about 10 Kohms at the fundamental frequency.

4. The apparatus of claim 3, wherein said reactance is less than about 100 ohms at the fundamental frequency.

5. The apparatus of claim 1, wherein said fundamental frequency is greater than about 880 MHz.

6. The apparatus of claim 1, wherein said capacitor has a capacitance between about 1 pF and about 100 pF.

7. The apparatus of claim 1, wherein said determined electrical length, $\theta$, conforms to the following equation:

$$\theta = in v \tan(0.732\ R/Z),$$

where $$R = 1.365(V)^2/P, \text{ and}$$

P is the output power of the apparatus, V is the voltage level of said DC power source, and Z is the characteristic impedance of said TL.

8. The apparatus of claim 7, wherein said characteristic impedance, Z, is between about 25 ohms and about 75 ohms.

9. The apparatus of claim 7, wherein said TL has an electrical length of less than 90°.

10. The apparatus of claim 9, wherein said TL has an electrical length of less that about 45°.

11. The apparatus of claim 10, wherein said TL has an electrical length of between about 5° and about 15°.

12. A method for amplifying an input signal having a fundamental frequency to develop an output signal with the same frequency at a load, said method comprising the steps of:

applying the input signal to a switch responsive thereto;

developing parallel inductance across said switch at the fundamental frequency with a transmission line (TL) of a determined electrical length;

developing parallel capacitance across said switch at the fundamental frequency; and supplying DC power to said switch, said parallel inductance, and said parallel capacitance;

wherein said parallel inductance and capacitance develop a transient response across said switch to insure that as the switch transitions from on to off, the voltage across said switch remains low until the current through the switch is substantially zero, and prior to the switch's transition from off to on, the voltage across said switch and the voltage time derivative are substantially zero.

13. The method of claim 12, said determined electrical length, $\theta$, conforming to the following equation:

$$\theta = \text{invtan}(0.732\ R/Z_0),$$

where $$R = 1.365\ (V)^2/P, \text{ and}$$

where P is the amplifier output power, V is the voltage level of said DC power, and Z is the characteristic impedance of said TL.

14. The method of claim 13, wherein said characteristic impedance, Z, is between about 25 ohms and about 75 ohms.

15. The method of claim 13, wherein said TL has an electrical length of less that about 45°.

16. The method of claim 13, wherein said TL has a reactance of less than about 10 Kohms at the fundamental frequency.

17. The method of claim 16, wherein said reactance is less than about 100 ohms at the fundamental frequency.

18. The method of claim 12, wherein said step of applying parallel inductance and capacitance across said switch comprises the step of:

coupling a capacitor in parallel with said switch and with said TL.

19. The method of claim 18, wherein said capacitor has a capacitance of between about 1 pF and about 100 pF.

20. The method of claim 12, wherein the fundamental frequency is above about 880 MHz.

* * * * *